United States Patent [19]
Hashiguchi

[11] Patent Number: 6,084,438
[45] Date of Patent: Jul. 4, 2000

[54] DATA DETERMINATION CIRCUIT

[75] Inventor: Akihiko Hashiguchi, Kanagawa, Japan

[73] Assignee: Sony Corporation, Tokyo, Japan

[21] Appl. No.: 09/049,538

[22] Filed: Mar. 27, 1998

[30] Foreign Application Priority Data

Mar. 31, 1997 [JP] Japan ................................ P09-080395

[51] Int. Cl.$^7$ ................................................ G01R 19/00
[52] U.S. Cl. ................................ 327/53; 327/51; 327/66; 327/108
[58] Field of Search .................................. 327/108, 112, 327/51, 53, 66

[56] References Cited

U.S. PATENT DOCUMENTS

| | | | |
|---|---|---|---|
| 4,047,059 | 9/1977 | Rosenthal | 327/66 |
| 5,081,380 | 1/1992 | Chen | 327/262 |
| 5,162,680 | 11/1992 | Norman et al. | 326/44 |
| 5,418,482 | 5/1995 | Wong et al. | 327/51 |
| 5,506,522 | 4/1996 | Lee | 327/53 |
| 5,528,543 | 6/1996 | Stiegler | 368/207 |
| 5,789,948 | 8/1998 | Kim et al. | 327/55 |
| 5,949,278 | 9/1999 | Oguey | 327/543 |

*Primary Examiner*—Timothy P. Callahan
*Assistant Examiner*—Hai L. Nguyen
*Attorney, Agent, or Firm*—Ronald P. Kananen; Rader, Fishman & Grauer

[57] ABSTRACT

A P-type MOSFET transistor as a current source and an N-type MOSFET transistor are connected in series between a power supply and one end of a bit line that is also connected to a memory cell with the other end thereof. The gate electrode of the P-type MOSFET transistor and that of the N-type MOSFET transistor are then biased by a current capability setting circuit in such a manner that a current capability of the P-type MOSFET transistor is smaller than a current capability of a memory cell and a current capability of the N-type MOSFET transistor is larger than the current capability of the P-type MOSFET transistor.

11 Claims, 6 Drawing Sheets

DATA DETERMINATION CIRCUIT

BACKGROUND OF THE INVENTION

1. Field of the Invention

The present invention relates to a data determination circuit for determining a value of data corresponding to a state of current in a data line for a semiconductor circuit and more particularly relates to a current mode sense-type data determination circuit for detecting a state of the current flowing in a drive circuit for a data line.

2. Description of Related Art

"Current mode transfer" is a method of transferring data in Large Scale Integrated circuits (LSIs). The circuit for this current mode transfer has a current to voltage conversion function and is capable of transferring the data with low amplitude and at high speed. This method has therefore been widely used in recent years and is used, for example, in sense amplifiers of semiconductor memory circuits. In the memory circuit, the data line and the drive circuit for driving the data line correspond to a bit line of a memory and a memory cell, respectively.

FIG. 1 is a circuit diagram showing a related example of a current mode sense amplifier. In FIG. 1, a P-type MOSFET (hereinafter referred to as PMOS) Trp31 and an N-type MOSFET (hereinafter referred to as NMOS) Trn31 are connected in series between a power supply VDD and one end of the bit line 31, i.e. the source electrode of the PMOS Trp31 is connected to the power supply VDD and the source electrode of the NMOS Trn31 is connected to an end of the bit line 31, with the drain electrodes of the PMOS Trp31 and NMOS Trn31 being connected in common to a node N31. A sense output is then taken from the node N31.

The gate electrode and drain electrode of the PMOS Trp31 are connected together in a so-called diode connection and the voltage-current characteristic of the PMOS Trp31 is equivalent to that of a resistance that is offset by the value of the threshold. A reference voltage Vref is applied to the gate electrode of the NMOS Trn31. A memory cell 32 is connected between the other end of the bit line 31 and ground GND. The memory cell 32 has a function of allowing current to flow toward the ground or not in the bit line 31 depending on the state of the stored data which has a value of, for example, "1" or "0".

In the sense amplifier of the above configuration, the case where the memory cell 32 allows a current I to flow toward GND will now be considered. In this case, a potential VBL of the bit line 31 falls, and the gate-source voltage Vgs of the NMOS Trn31 increases to increase the current of the NMOS Trn31, so that the drain-source voltage Vds decreases. Namely, the NMOS Trn31 exhibits a negative resistance characteristic where the applied voltage necessary for flowing the current is reduced with an increase of the current.

Since the PMOS Trp31 and the NMOS Trn31 exhibit characteristics of resistance and negative resistance, respectively, there exists the following condition:

Vds (Trp31)+Vds (Trn31)≈constant, where there is little or no change in the potential of the bit line 31 depending on the presence or absence of the current I. The current to output voltage characteristic of this circuit is shown by a diagram in FIG. 2. In this characteristic diagram, VN31 is the potential of the node N31.

There are, however, the following problems with the sense amplifier of the above configuration as a related example. Firstly, it is difficult to suppress fluctuations in the potential of the bit line 31, if transconductance gm of the NMOS TraN31 is not large. Secondly, as becomes clear from the characteristic diagram of FIG. 2, the PMOS Trp31 exhibits a characteristic of a resistance that is linear. This causes the potential VN31 of the node N31 to make a transition with respect to the current I of the memory cell 32 with a certain extent of inclination that results in lowered sensitivity to the change in the current I.

Thirdly, the current in the PMOS Trp31 as a current source has to be made minute in order to reduce the power consumption of the sense amplifier system. For this purpose, the channel width of the PMOS Trp31 has to be made minute and the channel length has to be made large, with this having a possibility of occupying an extremely large surface area in some cases. The first problem is usually dealt with by the method described in the following as another related example with reference to FIG. 3 showing a circuit configuration therefor.

In FIG. 3, portions that are the same as portions in FIG. 1 are given the same numerals. The circuit configuration is the same as that in FIG. 1, with the exception that a bias circuit 33 is inserted between the gate electrode of the NMOS Trn31 and the bit line 31. Here, the bias circuit 33 has a circuit configuration having a feedback function which rises the output potential as the potential VBL of the bit line 31 falls.

The operation of the circuit of sense amplifier in this another related example will now be described with reference to the waveform diagram of FIG. 4. When the potential VBL of the bit line 31 falls, the reference voltage Vref is raised to increase the current in the NMOS Trn31, so that the potential difference across the NMOS Trn31 is decreased and the fall in the potential VBL of the bit line 31 is halted. When the VBL of the bit line 31 rises, the reference voltage Vref falls to decrease the current in the NMDS Trn31, the flow of current into the bit line 31 therefore falls and rising of the potential VBL of the bit line 31 is halted.

As is apparent from FIG. 4, the potential VN31 of the node N31 makes a comparatively rapid transition to exhibit a good sensitivity with respect to the change in the current I.

The above described circuit operation brings about improvement with regards to the problem due to the small transconductance gm of the NMOS Trn31. However, when the circuit of the above configuration is adopted, the circuit voltage has to be in a range where the bias circuit 33 operates sufficiently and this will cause increases in the power consumption of the bias circuit 33 and the current consumed by the memory cells 32. Further, it is necessary to add this bias circuit 33 to all sense amplifiers and, for multi-bit sensing, this will therefore results in undesirable increases in the surface area and power consumption.

SUMMARY OF THE INVENTION

Since the present invention sets out to resolve the above problems, it is an object of the present invention to provide a data determination circuit that enables the realization of multi-bit sensing with a small surface area as well as low power consumption while retaining the advantages of current mode sensing of low amplitude, high-speed sensing and a current to voltage conversion function.

In order to achieve the above object, a data determination circuit for determining a value of data corresponding to a state of current in a data line of a semiconductor device, comprises a current source, a driving circuit and a current capability setting circuit. The current source is connected to the data line. The driving circuit is for driving the data line.

The current capability setting circuit is for setting a current capability, which is defined as the maximum current that can be carried under a given operating condition, of the current source to be smaller than a current capability of the driver circuit of the data line.

With the data determination circuit of the above configuration, a current capability of the current source is smaller than that of the driver circuit of the data line. Therefore, when the current of the driver circuit exceeds the current capability of the current source, the potential of the sense output (determination output) changes with an amplitude substantially close to an amplitude exhibited by a CMOS, this transition is extremely rapid, and extremely high sensitivity is exhibited in sensing the state of the bit line.

DETAILED DESCRIPTION OF THE PREFERRED EMBODIMENTS

In the following details of the embodiments of the present invention will be described with reference to the drawings.

First Embodiment

Figure 1:
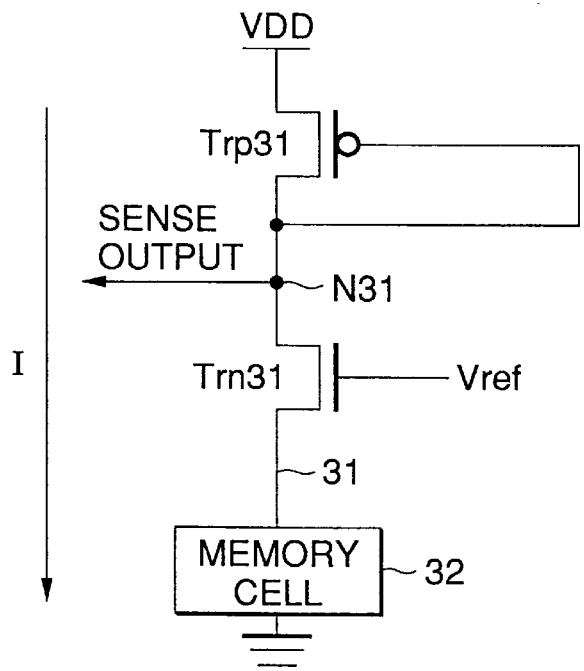
FIG. 1 is a circuit diagram showing an example of a circuit of a related art.
Figure 2:
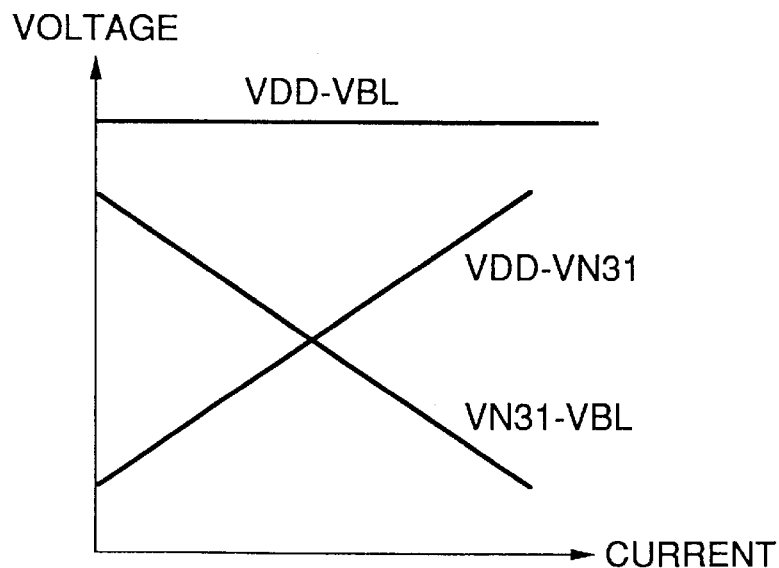
FIG. 2 is a diagram showing a current to output voltage characteristic of the circuit of the example of the related art in FIG. 1.
Figure 3:
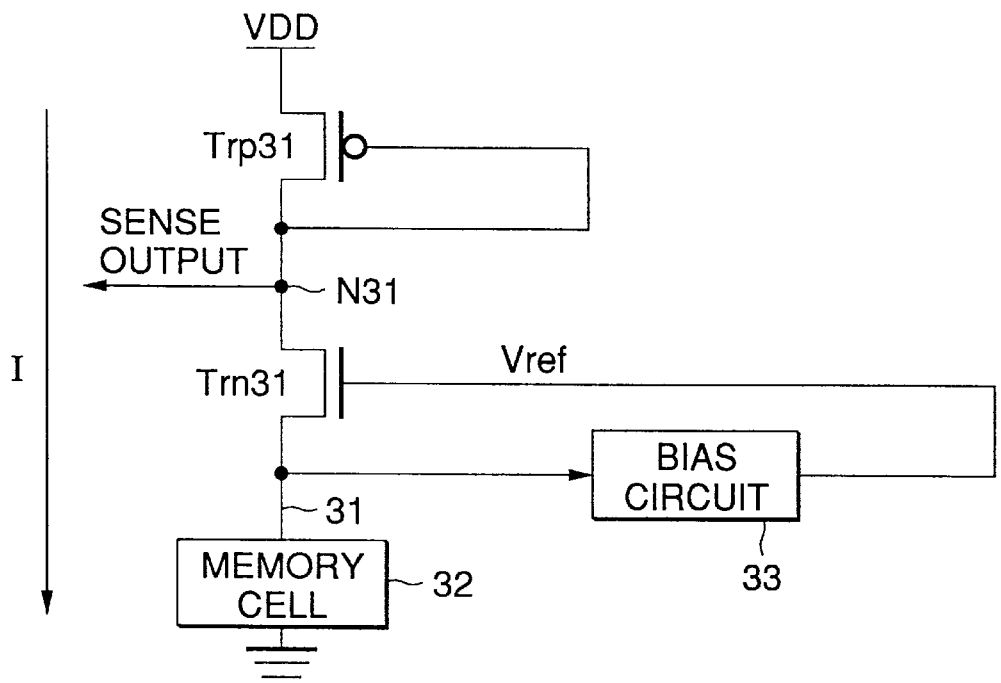
FIG. 3 is a circuit diagram showing another example of a circuit of the related art.
Figure 4:
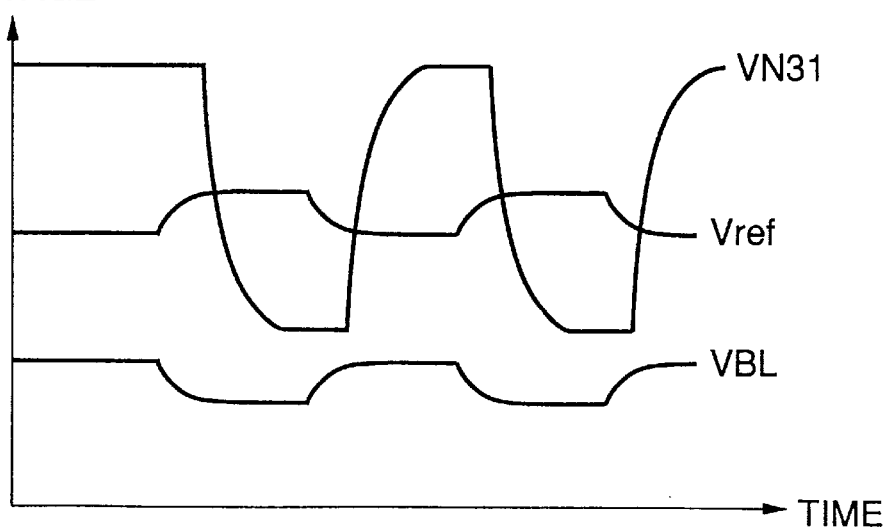
FIG. 4 is a waveform diagram showing an operation of the circuit of FIG. 3.
Figure 5:
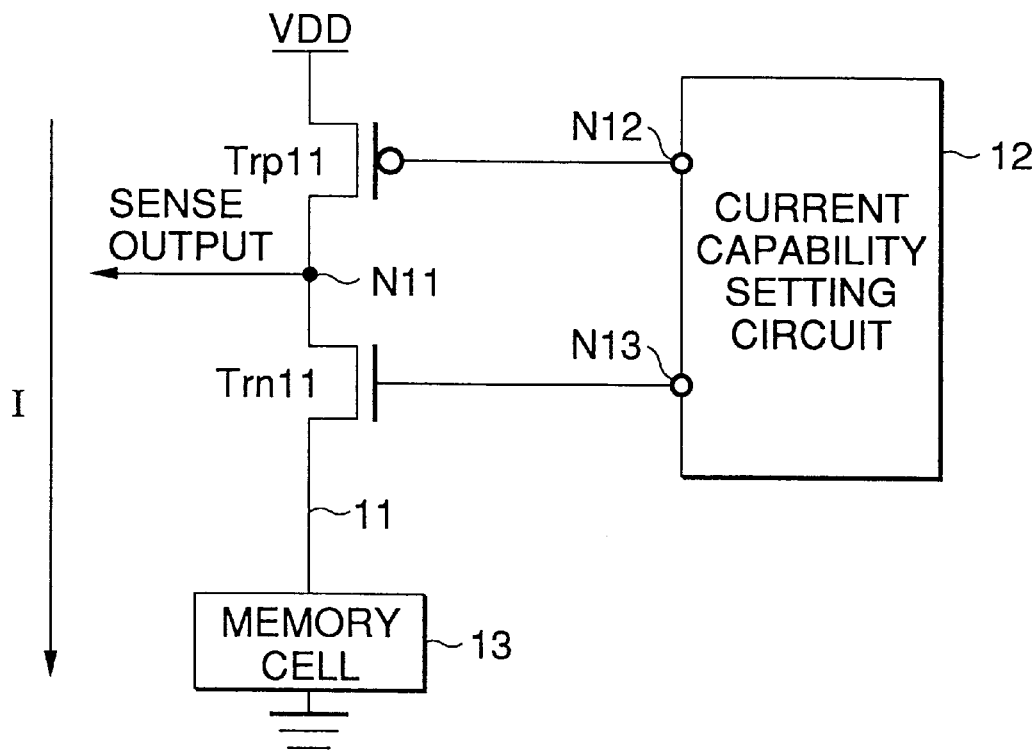
FIG. 5 is a circuit diagram showing an embodiment of the present invention.

FIG. 5 is a circuit diagram showing a first embodiment of the present invention applied to, for example, a sense amplifier for a semiconductor memory circuit. In this case, the data line corresponds to a memory bit line and the drive circuit for the data line corresponds to a memory cell.

In FIG. 5, a transistor PMOS Trp11 constituting a current source and a transistor NMOS Trn11 are connected in series between a power supply VDD and one end of a bit line 11. Namely, the source electrode of the PMOS Trp11 is connected to the power supply VDD and the source electrode of the NMOS Trn11 is connected to one end of the bit line 11, with the drain electrodes of the PMOS Trp11 and NMOS Trn11 being connected in common to a node N11. The determined output for the value represented by the state of current in the bit line 11, i.e. the sense output, is taken out from the node N11.

Figure 6:
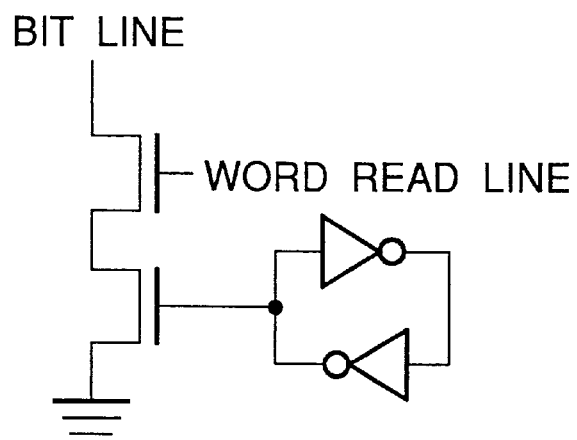
FIG. 6 is a circuit diagram showing an example of a memory cell.

The gate electrode of the PMOS Trp11 is connected to one output terminal N12 of a current capability setting circuit 12 and the gate electrode of the NMOS Trn11 is connected to the other output terminal N13 of the current capability setting circuit 12. A memory cell 13 is connected between the other end of the bit line 11 and ground GND. The memory cell 13 has a function for allowing current to flow or not in the bit line 11 toward ground GND depending on the state of the stored data which has a value of, for example, "1" or "0". One example of the memory cell has a circuit configuration shown in FIG. 6. Here, only the read out side circuit configuration is shown in FIG. 6 for simplicity.

The current capability setting circuit 12 biases the gate electrode of PMOS Trp11 in such a manner that the current capability of the PMOS Trp11 as the current source is smaller than the current capability of the memory cell 13. Here, the current capability is defined as the maximum current that can be carried under a given operating condition. As a result of this, the PMOS Trp11 operates in a saturation region of the current during a potential transition of the node N11. The current capability setting circuit 12 also biases the gate electrode of the NMOS Trn11 in such a manner that the current capability of the NMOS Trn11 exceeds the current capability of the PMOS Trp11 when the potential of the bit line 11 falls. The details of the specific circuit configuration for this current capability setting circuit 12 will be described later.

Figure 7:
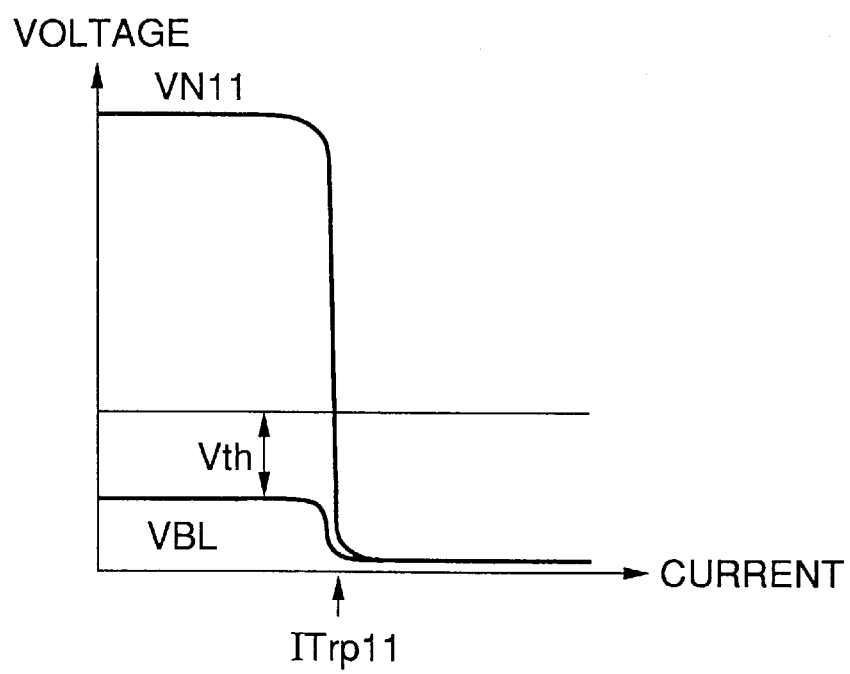
FIG. 7 is a diagram showing a current to voltage characteristic of the embodiment of the present invention.

FIG. 7 shows the current to voltage characteristics for the circuit of FIG. 5. As becomes clear from the current to voltage characteristics, since the current I for the memory cell 13 exceeds current capability ITrp11 of the PMOS Trp11, potential VN11 of the node 11 is changed to a level with an amplitude substantially close to that exhibited by the CMOS and it can be seen that this transition is so rapid that the sensitivity to the current is very high.

Figure 8:
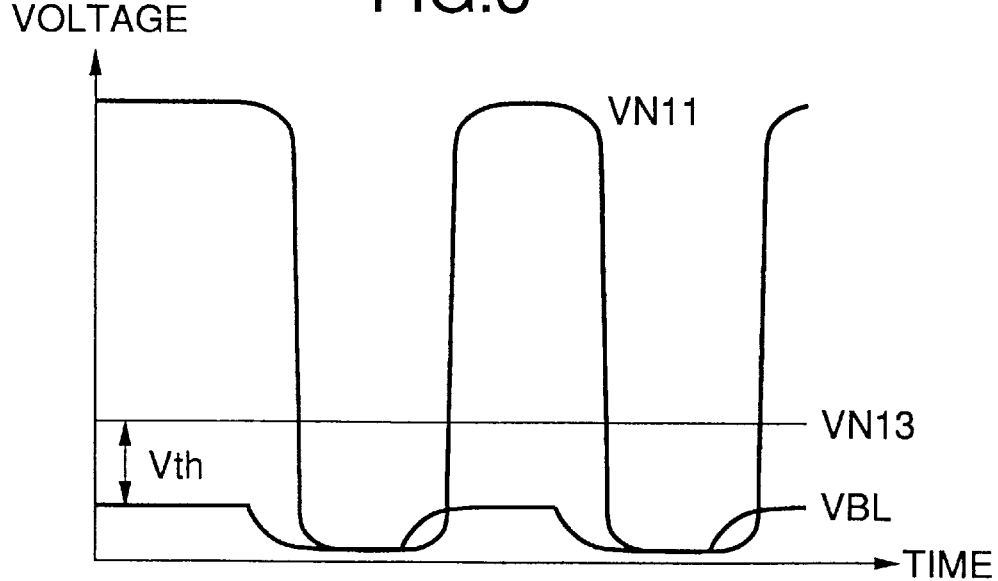
FIG. 8 is a waveform diagram showing an operation of the circuit of FIG. 5.

The operation of the sense amplifier circuit of the above configuration will now be described with reference to the waveform diagram of FIG. 8. First, the operation when a current I flows in the memory cell 13 will be described. In this case, the above described conditions:

current capability of Trp11<current capability of memory cell 13 current capability of Trp11<current capability of Trn11 are fulfilled, so that the potential VBL of the bit line 11 falls and the potential VN11 of node N11 approximately reaches the level of GND.

Next, the operation of the case when the current I does not flow at the memory cell 13 will be described. In this case, since the condition is;

current capability of Trp11>current capability of memory cell 13, the potential VN11 of the node N11 approximately reaches the level VDD (power supply voltage). At this time, the potential VBL of the bit line 11 only rises to a level that makes the gate-source voltage Vgs of the NMOS Trn11 reach the threshold voltage Vth of the NMOS Trn11.

Namely, if we let VN13 be the gate potential (i.e. the potential of the output terminal N13 of the current capability setting circuit 12), the potential VBL of the bit line 11 only varies within the range.

GND<VBL<VN13.

For example, if the gate potential VN13 of the NMOS Trn11 is 1V with the threshold voltage Vth of the NMOS Trn11 being 0.5V, the amplitude of the voltage of the bit line 11 is 0.5V. Therefore, in the gate potential VN13 of the NMOS Trn11 is set appropriately by the current capability setting circuit 12, the amplitude of the bit line 11 can be suppressed so as to be extremely small.

As described above, the conditions for the gate potential VN12 of the PMOS Trp11 is that the current capability of the PMOS Trp11 is less than the current capability of the memory cell 13 when current I flows through the memory cell 13. Further, the condition for the gate potential VN13 of the NMOS Trn11 is that the current capability of the NMOS Trn11 exceeds the current capability of the PMOS Trp11 when current I flows through the memory cell 13.

Figure 9:
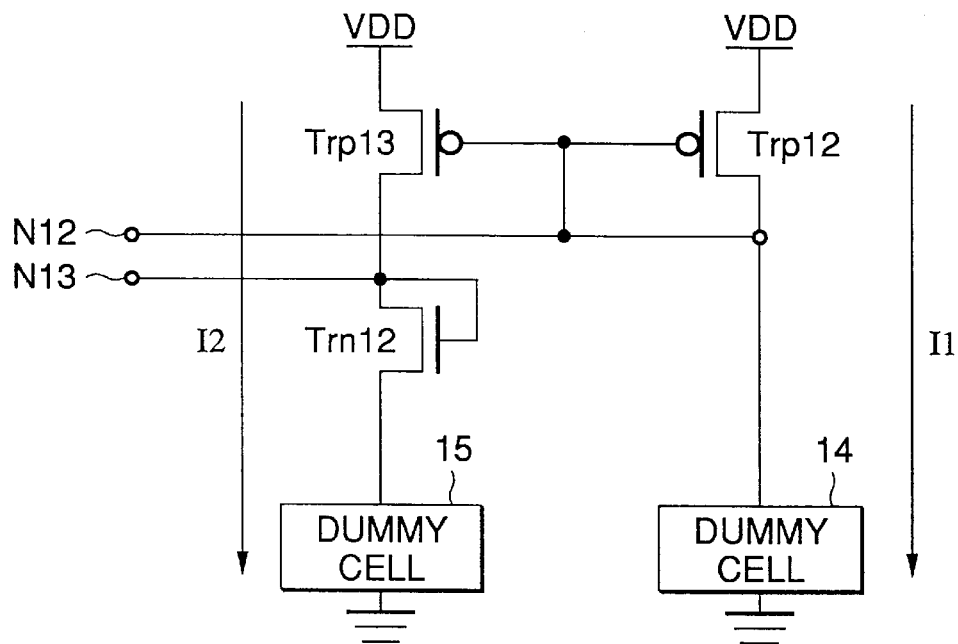
FIG. 9 is a circuit diagram showing an example of a current capability setting circuit.

An example of the circuit configuration of the current capability setting circuit 12 for setting the current capability is shown in FIG. 9. In FIG. 9, the source electrodes of transistors PMOS Trp12 and PMOS Trp13 are connected to the power supply VDD and the gate electrodes (control electrodes) are connected in common. The PMOS Trp12 is in a diode connection for which the gate electrode and the drain electrode are connected together. The drain electrode of this PMOS Trp12 is connected to an output terminal N12 and a dummy cell 14 as a dummy memory cell.

On the other hand, the drain electrode of the PMOS Trp13 is connected to an output terminal N13 and the drain electrode of NMOS Trn12. The gate electrode and drain electrode of the NMOS Trn12 are connected to give a diode connection configuration. The source electrode of the NMOS Trn12 is connected to a dummy cell 15 as a dummy memory cell. With a circuit of this configuration, when the sizes of each of the transistors for the PMOS Trp12 and PMOS Trp13 are made to be equal, a current mirror circuit is constituted where a current I1 flowing at the PMOS Trp12 and a current I2 flowing at the PMOS Trp13 are equal.

If the current capability of the PMOS Trp12 is set to be large, the current I1 is determined by the current capability of the dummy cell 14. If the current capability of the dummy cell 14 is then made equal to the current capability of the memory cell 13 of FIG. 5, the current I1 becomes equal to the current I flowing in the bit line 11 of FIG. 5. Further, if the channel width of the PMOS Trp12 is set to be twice the channel width of the PMOS Trp11 of FIG. 5, it becomes clear that the current capability of the PMOS Trp11 becomes half of the current capability of the memory cell 13. Namely, the current capability of the PMOS Trp11 can be set by determining the ratio of the size of the PMOS Trp12 with respect to the PMOS Trp11.

The current I2 is determined by the ratio of the current capability of the PMOS Trp12 to that of the PMOS Trp13. For example, if the ratio of this current capability is set to be 1, then I1=I2. At this time, if the channel width of the NMOS Trn12 is set to be half the channel width of the NMOS Trn11 of FIG. 5, it becomes clear that the NMOS Trn11 has twice the current capability of the NMOS Trn12. Namely, the current capability of the NMOS Trn11 can be set by the ratio of the size of the NMOS Trn12 with respect to that of the NMOS Trn11.

By adopting a current mirror circuit for the current capability setting circuit 12 for setting the current capacities of the PMOS Trp11 and NMOS Trn11, the conditions for the gate potentials VN12 and VN13 for PMOS Trp11 and NMOS Trn11, i.e. the condition for making:

current capability of Trp11<current capability of memory cell 13; and current capability of Trp11<current capability of Trn11 can be set in a simple manner of determining a straightforward transistor size ratio.

In addition, such an influence as is due to variations in the fabrication process for the memory cell 13 or temperature fluctuations can be compensated by adopting a current mirror circuit as the current capability setting circuit 12 and by using the dummy cell 14 having the same current capability as the memory cell 13 as the aforementioned circuit load. There is therefore the advantage that the conditions for the gate potentials VN12 and VN13 of the PMOS Trp11 and NMOS Trn11 can be set in a more precise manner. Further, only one current capability setting circuit 12 is necessary for a plurality of sense amplifiers, therefore, this causes little increase in surface area as a result of providing the current capability setting circuit 12 in the case of multi-bit sensing.

Figure 10:
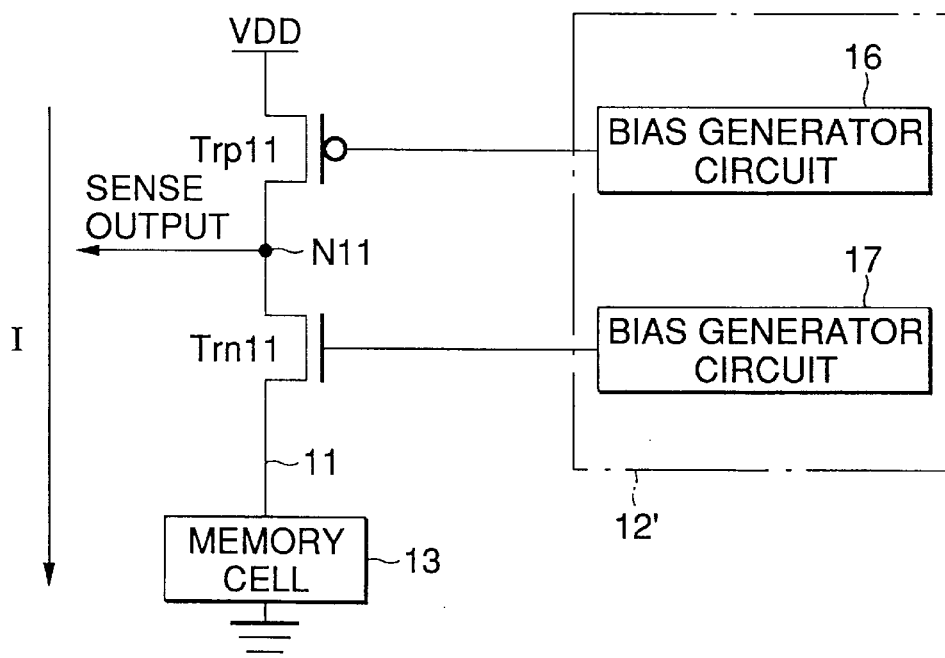
FIG. 10 is a block diagram showing another example of a current capability setting circuit.

The current capability setting circuit 12 is by no means limited to have a current mirror circuit configuration but any circuit configuration is possible if the circuit satisfies the above conditions for the gate potentials VN12 and VN13 of the respective PMOS Trp11 and the NMOS Trn11. As an example, a current capability setting circuit 12' as shown in FIG. 10 can be configured in which bias generating circuits 16 and 17 are used for generating bias voltages using such a voltage dividing circuit as is configured with resistors connected in series. Bias voltages capable of fulfilling the above conditions are then generated by these bias generating circuits 16 and 17.

As described above, in a semiconductor memory circuit, the PMOS Trp11 as a current source is connected to the bit line 11 and the current capability of this PMOS Trp11 is set to be smaller than the current capability of the memory cell 13. The sense output, i.e. the potential VN11 of the node N11 therefore changes with an amplitude close to that of the CMOS and this transition is extremely rapid so that sensing of an extremely high sensitivity becomes possible. Further, since only one current capability setting circuit 12 has to be provided for a plurality of sense amplifiers, multi-bit sensing can be carried out with a small surface area while consuming low power.

Further, by connecting NMOS Trn11 between the PMOS Trp11 as a current source and the bit line 11 and setting the current capability of this NMOS Trn11 to be larger than the current capability of PMOS Trp11, the maximum potential of the bit line 11 can be kept close to the level GND. Namely, the amplitude of the potential of the bit line 11 can be limited to be small. Therefore, this enables the sense output to be taken out with so high a sensitivity that high-speed sensing becomes possible. At the same time, the voltage applied to the transistor comprising the memory cell 13 can be made to be extremely small, so that the current I flowing in the memory cell 13 can be kept small.

Second Embodiment

Figure 11:
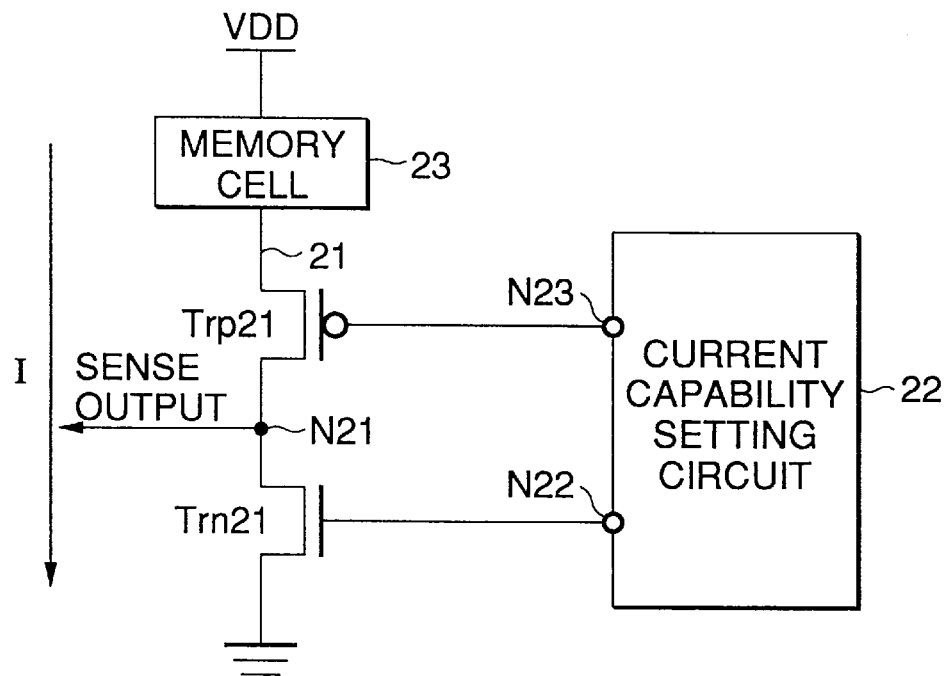
FIG. 11 is a circuit diagram showing another embodiment of the present invention.

FIG. 11 is a circuit diagram showing another embodiment of the present invention by making use of a characteristic of a complementary CMOS, i.e. a memory cell 23 is connected to VDD rather than to GND. In this case, the current source is configured of a transistor NMOS Trn21 with a source electrode connected to ground, and a gate electrode connected to one output terminal N22 of a current capability setting circuit 22.

The drain electrodes of the NMOS Trn21 and a PMOS Trp21 are connected in common at a node N21. The source electrode of the PMOS Trp21 is connected to a bit line 21 and the gate electrode of the PMOS Trp21 is connected to the remaining output terminal N23 of the current capability setting circuit 22. The current capability setting circuit 22 biases the gate electrode of NMOS Trn21 so that the NMOS Trn21 has a current capability smaller than that of the memory cell 23 and biases the gate electrode of the PMOS Trp21 so that the PMOS Trp21 has a larger current capability than the NMOS Trn21.

Figure 12:
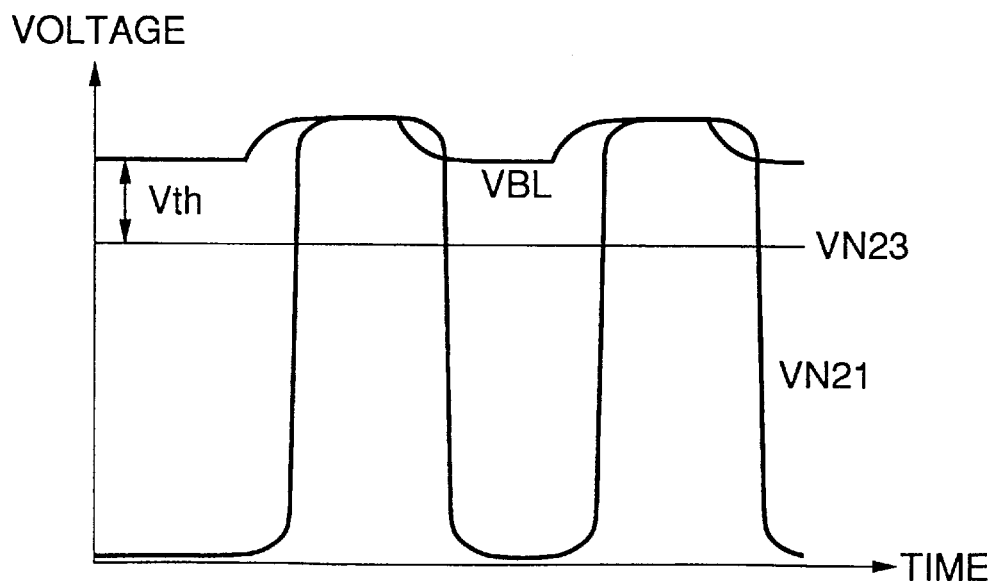
FIG. 12 is a waveform diagram showing an operation of the circuit of FIG. 11.

The operation of the sense amplifier of the above configuration will now be described with reference to the waveform diagram of FIG. 12. First, a description is given of the operation when a current I flows at the memory cell 23. In this case, the condition is given as:

current capability of Trn21<current capability of memory cell 23; and current capability of Trn21<current capability of Trp21;

a potential VBL of the bit line 21 rises, and a potential VN21 of the node 21 approximately reaches the level VDD.

Next, a description will be given for the case when current I does not flow through the memory cell 23. In this case:

current capability of Trn21>current capability of memory cell 23 and the potential VN21 of the node 21 reaches approximately the level of GND. At this time, the potential VBL of the bit line 21 only falls to the level at which a gate-source voltage Vgs of the PMOS Trp21 reaches the vicinity of Vth (threshold voltage) for the PMOS Trp21.

Namely, if we let VN23 be the gate potential of the PMOS Trp21 (i.e. the potential of the output terminal 23 of the current capability setting circuit 22), the potential VBL of the bit line 21 only changes within the range:

VDD<VBL<VDD−VN23+Vth

Therefore, in this embodiment also, if the gate potential VN23 of the PMOS Trp21 is appropriately set by the current capability setting circuit 22, amplitude of potential fluctuations of the bit line 21 can be kept extremely small.

In each of the above embodiments descriptions have been given of the cases in which the present invention is applied to sense amplifiers for determining values corresponding to the states of currents in the bit line for semiconductor memory circuit, but the data determining circuit of the present invention is by no means limited to applications in semiconductor memory circuits, and can be applied to all types of semiconductor circuits where data is transferred by current mode transfer.

As described above, according to the present invention, in a data determining circuit for determining a value of data corresponding to a state of current in a data line of a semiconductor circuit, a configuration is adopted where a current source is connected to a data line and the current capability of this current source is set to be smaller than the current capability of the driver circuit for driving this data line. This enables the realization of multi-bit sensing with a small surface area as well as low power consumption while retaining the advantages of the current mode sensing of low amplitude, high-speed sensing and a current to voltage conversion function.

What is claimed is:

1. A data determination circuit for determining a value of data corresponding to a state of current in a data line of a semiconductor device, comprising:

a current source connected to said data line;

a driver circuit driving said data line;

a current capability setting circuit, said current capability setting circuit setting a current capability of said current source to be less than a current capability of said driver circuit, wherein current capability is defined as a maximum current that can be carried under a given operating condition; and a voltage suppression transistor connected between said data line and said current source, said voltage suppression transistor having a current capability set to be greater than the current capability of said current source by said current capability setting circuit.

2. The data determination circuit of claim 1, wherein said current capability setting circuit is a current mirror circuit comprising a first transistor in a diode connection, a first dummy circuit connected in series with said first transistor and having substantially the same current capability as said driver circuit, a second transistor connected in common with a control electrode of said first transistor, a second dummy circuit connected in series with said second transistor and having substantially the same current capability as said driver circuit, and a third transistor in a diode connection connected between said second transistor and said second dummy circuit, and said current capability of said transistor for voltage suppression is set by a size ratio of said third transistor with respect to said transistor for voltage suppression.

3. A data determination circuit for determining a value of data corresponding to a state of current in a data line of a semiconductor device, comprising:

a current source connected to said data line;

a driver circuit driving said data line;

a current capability setting circuit, said current capability setting circuit setting a current capability of said current source to be less than a current capability of said driver circuit, wherein current capability is defined as a maximum current that can be carried under a given operating condition; and a voltage suppression transistor connected between said current source and said driver circuit, said voltage suppression transistor having a current capability set to be greater than the current capability of said current source by said current capability setting circuit.

4. A data determination circuit for determining a value of data corresponding to a state of current in a data line of a semiconductor device, comprising:

a current source connected to said data line;

a driver circuit driving said data line;

a voltage suppression transistor connected between said data line and said current source;

and a current capability setting circuit, said current capability setting circuit setting a current capability of said current source to be less than a current capability of said driver circuit and setting a current capability of said voltage suppression transistor to be greater than the current capability of said current source, wherein current capability is defined as a maximum current that can be carried under a given operating condition.

5. The data determination circuit of claim 4, wherein said current capability setting circuit is a current mirror circuit comprising a first transistor in a diode connection configuration, a first dummy circuit connected in series with said first transistor and having substantially the same current capability as said driver circuit, a second transistor connected in common with a control electrode of said first transistor, and a second dummy circuit connected in series with said second transistor and having substantially the same current capability as said driver circuit, and the current capability of said current source is set by a size ratio of said first transistor with respect to a transistor constituting said current source.

6. The data determination circuit of claim 4, wherein said current capability setting circuit is a current mirror circuit comprising a first transistor in a diode connection configuration, a first dummy circuit connected in series with said first transistor and having substantially the same current capability as said driver circuit, a second transistor connected in common with a control electrode of said first transistor, and a second dummy circuit connected in series with said second transistor and having substantially the same current capability as said driver circuit, and a third transistor in a diode connection connected between said second transistor and said second dummy circuit, and the current capability of said voltage suppression transistor is set by a size ratio of said third transistor with respect to said voltage suppression transistor.

7. The data determination circuit of claim 4, wherein said data line is a bit line of a semiconductor memory circuit and said driver circuit is a memory cell.

8. A data determination circuit for determining a value of data corresponding to a state of current in a data line of a semiconductor device, comprising:

a current source connected to said data line;

a driver circuit driving said data line;

a voltage suppression transistor connected between said current source and said driver circuit; and a current capability setting circuit, said current capability setting circuit setting a current capability of said current source to be less than a current capability of said driver circuit and setting a current capability of said voltage suppression transistor to be greater than the current capability of said current source, wherein current capability is defined as a maximum current that can be carried under a given operating condition.

9. The data determination circuit of claim 8, wherein said current capability setting circuit is a current mirror circuit comprising a first transistor in a diode connection configuration, a first dummy circuit connected in series with said first transistor and having substantially the same current capability as said driver circuit, a second transistor connected in common with a control electrode of said first transistor, and a second dummy circuit connected in series with said second transistor and having substantially the same current capability as said driver circuit, and the current capability of said current source is set by a size ratio of said first transistor with respect to a transistor constituting said current source.

10. The data determination circuit of claim 8, wherein said current capability setting circuit is a current mirror circuit comprising a first transistor in a diode connection configuration, a first dummy circuit connected in series with said first transistor and having substantially the same current capability as said driver circuit, a second transistor connected in common with a control electrode of said first transistor, and a second dummy circuit connected in series with said second transistor and having substantially the same current capability as said driver circuit, and a third transistor in a diode connection connected between said second transistor and said second dummy circuit, and the current capability of said voltage suppression transistor is set by a size ratio of said third transistor with respect to said voltage suppression transistor.

11. The data determination circuit of claim 8, wherein said data line is a bit line of a semiconductor memory circuit and said driver circuit is a memory cell.

* * * * *